United States Patent
Theriault et al.

(10) Patent No.: US 7,137,194 B2
(45) Date of Patent: Nov. 21, 2006

(54) APPARATUS AND METHOD FOR MAINTAINING A DRY ATMOSPHERE IN A SURFACE MOUNT DEVICE PLACEMENT MACHINE

(75) Inventors: Martin Theriault, Evanston, IL (US); Stephane Rabia, Westmont, IL (US); Jason Uner, Chicago, IL (US)

(73) Assignees: Air Liquide America LP, Houston, TX (US); American Air Liquide, Inc., Fremont, CA (US)

( * ) Notice: Subject to any disclaimer, the term of this patent is extended or adjusted under 35 U.S.C. 154(b) by 0 days.

(21) Appl. No.: 11/063,698

(22) Filed: Feb. 22, 2005

(65) Prior Publication Data

US 2005/0138801 A1 Jun. 30, 2005

Related U.S. Application Data

(62) Division of application No. 09/698,817, filed on Oct. 26, 2000, now Pat. No. 6,877,219.

(60) Provisional application No. 60/169,167, filed on Dec. 6, 1999, provisional application No. 60/161,387, filed on Oct. 26, 1999.

(51) Int. Cl.
*H05K 3/30* (2006.01)

(52) U.S. Cl. .............................. 29/832; 29/739; 29/740; 29/825; 29/833; 29/836

(58) Field of Classification Search .................. 29/825, 29/832, 840, 739, 740, 833, 836; 206/213.1, 206/409

See application file for complete search history.

(56) References Cited

U.S. PATENT DOCUMENTS

| 4,799,450 | A | * | 1/1989 | Cornellier | 118/63 |
| 5,318,181 | A | * | 6/1994 | Stover et al. | 206/459.1 |
| 5,364,045 | A | * | 11/1994 | Clayton et al. | 242/588.6 |
| 5,364,225 | A | * | 11/1994 | Hecht et al. | 414/805 |
| 5,609,290 | A | * | 3/1997 | Bobbio et al. | 228/206 |
| 6,054,682 | A | * | 4/2000 | Ochoa et al. | 219/388 |
| 6,622,399 | B1 | * | 9/2003 | Theriault et al. | 34/380 |

* cited by examiner

*Primary Examiner*—Carl J. Arbes
(74) *Attorney, Agent, or Firm*—Christopher J. Cronin

(57) ABSTRACT

The apparatus and method of the present invention relates use a dry atmosphere in the component storage portion of the surface mount device placement machine. The dry atmosphere provides the benefit of eliminating the baking process and other moisture management issues. In accordance with one aspect of the present invention, a component placement machine for placing components on printed circuit boards includes a component storage area, a component placement system for taking components from the component storage area and placing the components on the printed circuit boards, an enclosure surrounding the component storage area, and a dry gas delivery system for delivery of a dry gas to the storage area to prevent moisture from being absorbed by the components.

10 Claims, 4 Drawing Sheets

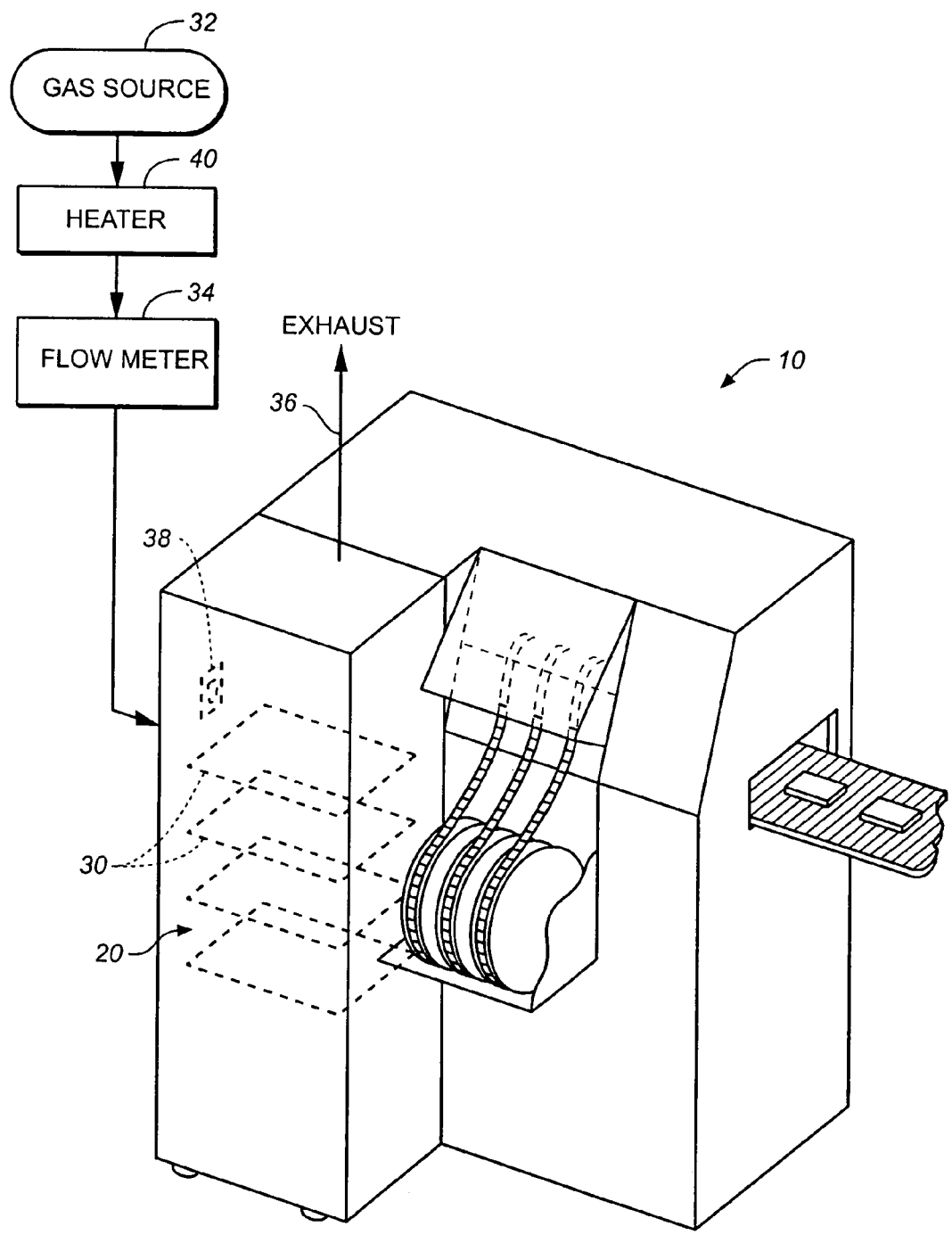
FIG._1

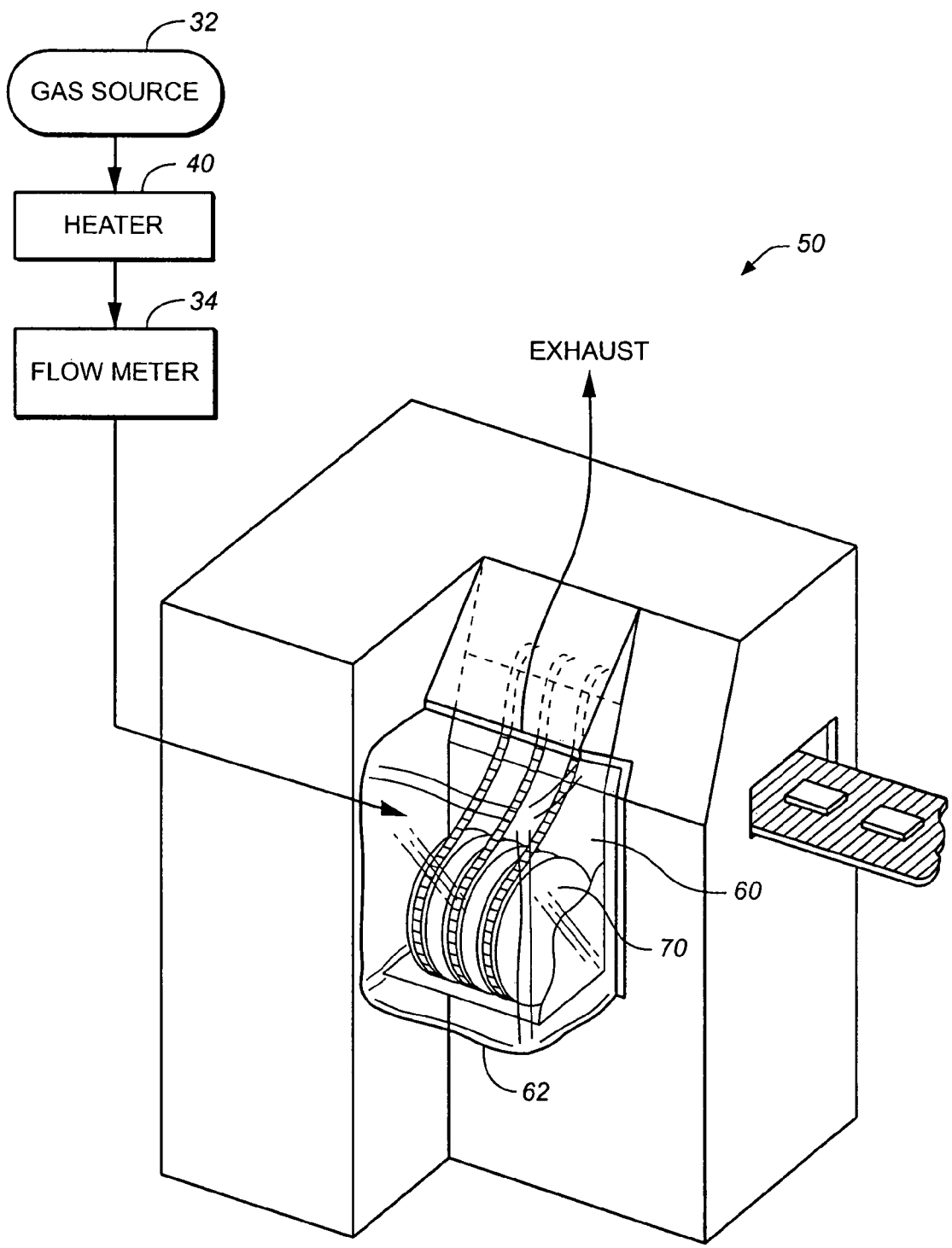
FIG._2

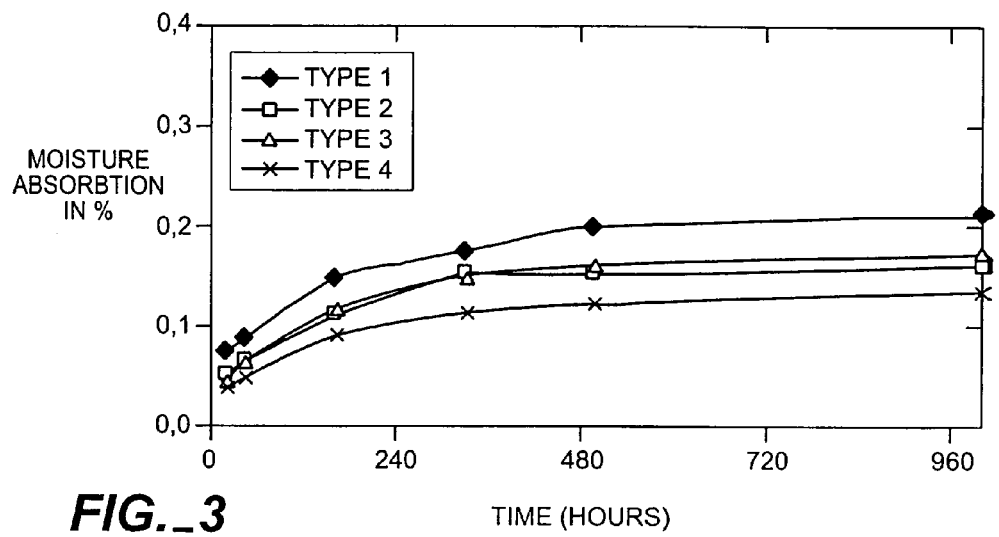
FIG._3
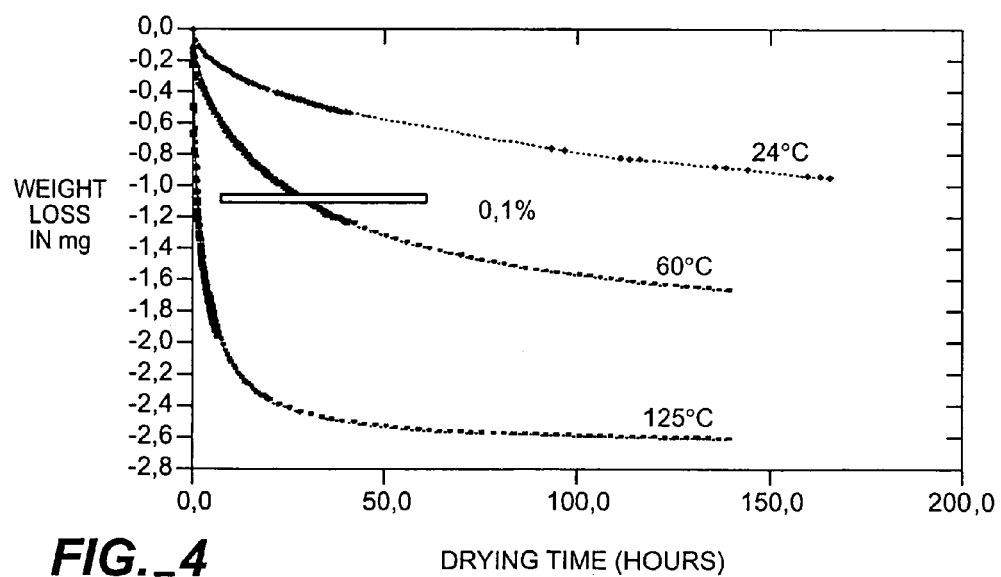
FIG._4

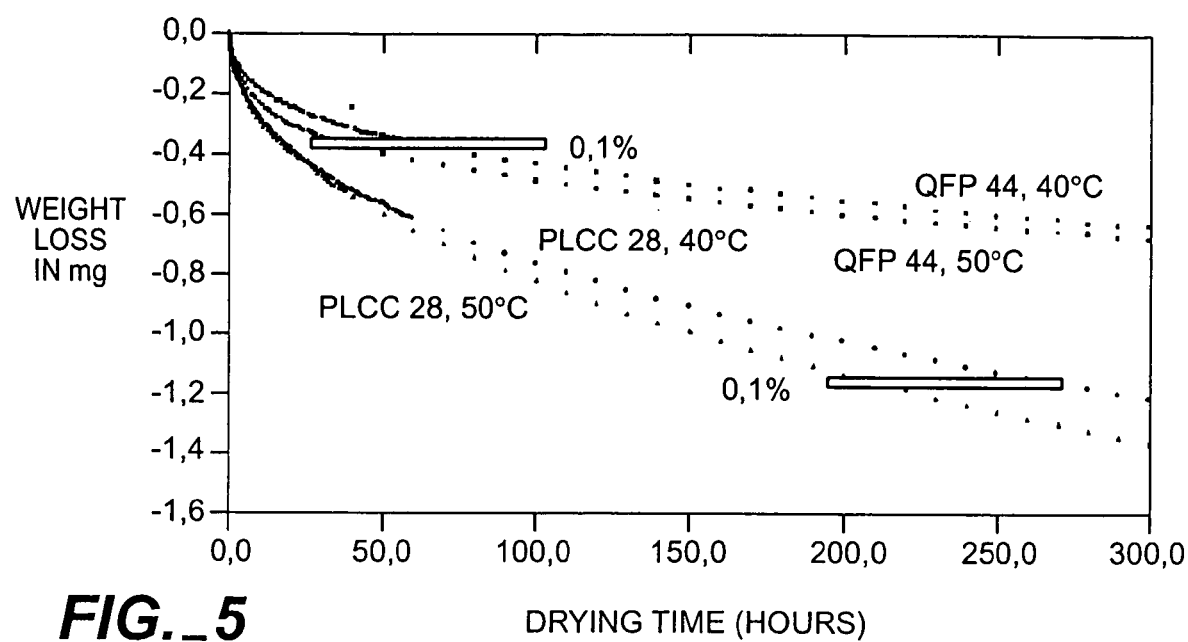
FIG._5

APPARATUS AND METHOD FOR MAINTAINING A DRY ATMOSPHERE IN A SURFACE MOUNT DEVICE PLACEMENT MACHINE

This application claims priority to U.S. Provisional Patent Application No. 60/161,387, filed Oct. 26, 1999 and U.S. Provisional Patent Application No. 60/169,167, filed Dec. 6, 1999, which are incorporated herein by reference in their entirety. This application is also a divisional of 09/698,817 filed Oct. 26, 2000, now U.S. Pat. No. 6,877,219.

BACKGROUND OF THE INVENTION

1. Field of the Invention

The invention relates to the field of electronic packaging and assembly of electrical components, and more particularly, the invention relates to a system and method for preventing moisture damage to electrical components by maintaining a dry atmosphere in the storage area of a component placement machine.

2. Brief Description of the Related Art

Plastic cases for electronic active components or integrated circuits are gaining in popularity over ceramic or metallic packages as they are easier to work with and less expensive. They have, however, the disadvantage of being sensitive to moisture. Moisture from atmospheric humidity is absorbed by the package via permeation. If the moisture level inside the package reaches a critical point, the device may be damaged when brought up to temperature during the reflow soldering process. These types of moisture induced failures are referred to as the popcorning effect due to the audible popping when a crack appears in the package from moisture overpressure. If cracking occurs, air and moisture may contact the silicon die inside the package resulting in corrosion. The reliability of the product is seriously jeopardized if an integrated circuit package cracks during reflow. Micro-cracking is also hard to detect. Therefore, it is critical for printed circuit board assemblers to avoid moisture induced failures and popcorning defects and to limit the exposure of components to moisture.

There are currently no specific solutions to prevent the absorption of moisture. Assemblers normally adopt a "moisture management system" in order to control the moisture exposure levels. A part of such a system involves re-bagging the components in dry and desiccant bags after an initial usage. Another part of the current practice is to monitor floor life of a component or the time that the component is exposed to atmosphere moisture. After a floor life has expired, the moisture in the package may be reduced by performing a process referred to as "baking" during which the component is heated to remove moisture.

The limit level or critical moisture level (level at which cracking will occur) for a package depends on the package itself and the temperature at which it will be exposed during the assembly/soldering process. A higher reflow temperature results in a lower critical moisture level. The determination of the weight gain percent failure level is therefore component specific and process specific.

While baking prevents the moisture-induced failure and the popcorning effect, it is time consuming and may be difficult to manage. For example, products qualifying with a moisture sensitivity corresponding to the IPC/JEDEC J-STD-020 standard are normally baked at an elevated temperature for a period varying from 24 hours (baked at 125° C.) to a week or more (baked at 40° C.). Sometimes this baking process is shortened or interrupted by the assembler because the components are urgently required to finish a production load that is back ordered. Baking also oxidizes the components and ages them by growing the intermetallic layer of the component joint structure.

As the reflow soldering temperatures are expected to increase when lead-free alloys are introduced on the market (217° C. and higher melting points for lead-free alloys versus a 183° C. melting point for standard lead alloys) moisture control will become even more critical in the future.

Accordingly, it would be desirable to provide a system which eliminates the need for baking and still prevents moisture absorption and the associated moisture induced failure, including popcorning.

It would also be desirable to provide a system to remove moisture from components without baking.

SUMMARY OF THE INVENTION

The present invention relates to the use of a dry atmosphere in the component storage portion of the surface mount device placement machine. The dry atmosphere in the placement machine normally combined with the use of a dry box provides the benefit of eliminating the baking process and other moisture management issues.

In accordance with one aspect of the present invention, a component placement machine for placing components on printed circuit boards includes a component storage area, a component placement system for taking components from the component storage area and placing the components on the printed circuit boards, an enclosure surrounding the component storage area, and a dry gas delivery system for delivery of a dry gas to the storage area to maintain a dry atmosphere and to prevent moisture from being absorbed by the components.

In accordance with an additional aspect of the present invention, a method of mounting electronic components on a printed circuit board includes the steps of: storing electronic components in a storage area of a surface mount device placement machine; maintaining a dry atmosphere in the storage area by enclosing the storage area and injecting dry gas into the storage area; removing the components from the storage area; and mounting the components on a printed circuit board.

BRIEF DESCRIPTION OF THE DRAWINGS

The invention will now be described in greater detail with reference to the preferred embodiments illustrated in the accompanying drawings, in which like elements bear like reference numerals, and wherein:

FIG. 1 is schematic perspective view of a surface mount device pick and place machine having a dry atmosphere delivered to a storage area for components stored in trays;

FIG. 2 is a schematic perspective view of a surface mount device pick and place machine having a dry atmosphere delivered to a storage area for components stored on tape (bobbins), stick, or in a bulk feeder;

FIG. 3 is a graph of the moisture absorption in weight percent of four types of components over time in an atmosphere of 30° C. and 60% relative humidity;

FIG. 4 is a graph showing the weight loss in milligrams of components in a nitrogen atmosphere at three different temperatures; and FIG. 5 is a graph illustrating the weight loss in milligrams of two components in a nitrogen atmosphere at two different temperatures.

DETAILED DESCRIPTION OF THE PREFERRED EMBODIMENTS

The invention eliminates the need for baking to remove moisture from electronic components by maintaining a dry atmosphere in the component storage area of surface mount device (SMD) placement machine, such as a pick and place machine. SMD placement, pick-&-place, or chip shooting machines take components from trays, tapes (bobbins), sticks, bulk feeders, or the like and strategically put them onto printed circuit boards (PCBs). In the present invention, the components to be placed are stored prior to placement in a dry atmosphere within the machine and are not exposed to moisture during this storage time. Therefore, the necessity for tracking floor life or for baking when floor life is exceeded are eliminated. The invention targets the moisture sensitive components stored in trays, tapes (bobbins), sticks, bulk feeders, and other storage systems within a SMD placement machine. These components are stored in the SMD placement machine prior to feeding into the placement turrets or heads of the machine for placement on a printed circuit board.

The use of the dry atmosphere in the component storage portion of the machine normally combined with the use of dry boxes or cabinets provides the benefit of eliminating the baking process and other moisture management issues. A dry gas according to the present invention may be defined as a gas having a relative humidity at least 10% less than a gas being replaced or as a gas having a relative humidity of about 10% or less. The invention will also have a positive effect on the quality and reliability of the assembled product by reducing the occurrence of latent defects and field failures associated with moisture overpressure. Additionally, elimination of baking translates to lower package oxidation and better intermetallic compound which impact positively on the final product quality and reliability. With this invention, components can now be left in the machines indefinitely without having to worry about moisture exposure limits and constraints. When the components are removed from the machine, they can be re-bagged in dry bags or stored in adjacent dry boxes.

FIGS. 1 and 2 illustrate two exemplary embodiments of a SMD placement, pick and place machine having a system for maintaining stored components in a dry atmosphere. In the embodiment of FIG. 1, the pick and place machine 10 includes a storage area 20 for storing trays 30 which each contain a plurality of components. The storage area 20 may be a removable wheeled cart semi-closed by panels which are preferably ESD compatible. Preferably, the storage area 20, also called a feeder cart, is closed on five sides with a sixth side of the storage area partially enclosed and having a door for removal of trays and/or an opening for the removal of components from the trays. Gaskets and/or curtains may be used at the door and/or opening.

A dry atmosphere maintaining system includes a gas source 32 and a flow meter 34 or other controller for delivering dry gas to an inlet to the storage area 20. An exhaust 36 is provided for exhausting gas from the storage area 20. The exhaust can also be provided through a curtain or other seal. In operation, the dry atmosphere maintaining system is turned on to deliver dry gas to the storage area 20. The dry gas may be nitrogen or any other dry gas including dry air. The injected dry gas displaces the humid air in the enclosure and prevents moisture absorption by the components. The dry gas may be slightly heated by the heater 40 for better efficiency. For example, the dry gas may be heated to about 10° C. to about 60° C., preferably about 20° C. to about 50° C.

The flow of dry gas depends on the size of the enclosure and the targeted relative humidity. A flow of 100 scfh $N_2$ may be sufficient to maintain a dry atmosphere for the standard placement machine. One example of a standard placement machine has a component storage area of about 3–6 cubic feet. The dry atmosphere maintaining system may be operated in two or more modes. For example, a first relatively high flow level may be used when the storage area 20 is open and a second lower flow level may be used in an atmosphere maintenance mode when the storage area 20 is closed. The flow rates may be automatically controlled by a controller which senses a location of a door in an opened or closed position.

Optionally, a relative humidity meter 38 can be provided for sensing a humidity of the atmosphere within the storage area 20 and the flow meter 34 can regulate the flow of the dry gas. When the relative humidity set point is reached, the flow is intermittently turned on or off or the flow rate is adjusted to maintain the preset relative humidity point.

FIG. 2 illustrates an alternative embodiment of a SMD placement, pick and place machine 50 having a system for maintaining stored components in a dry atmosphere. In the embodiment of FIG. 2, the pick and place machine 50 includes a storage area 60 for storing bobbins 70 which each contain a plurality of components. Although bobbins 70 have been illustrated, tapes, sticks, or other storage systems may also be used. The storage area 60 is enclosed by a hood 62 of plexiglass or other ESD dissipative material. The hood 62 is preferably provided with curtains and gaskets to prevent leakage.

In the embodiments of FIGS. 1 and 2 the dry gas has been illustrated as injected through a single inlet. However, in some instances it is advantageous to inject the dry gas through multiple inlets such as sprayers or diffusers arranged to provide a consistent dry atmosphere around all of the components in the storage area.

Although specific examples of SMD placement machines have been illustrated, it should be understood that the present invention may be modified for other configurations of component placement machines. The exact configuration of the storage area containment system including hoods, walls, gaskets, and curtains will vary depending on the configuration of the particular machine. Another example of an SMD placement machine which may incorporate the present invention is a chip shooting machine.

The invention eliminates the need to bake moisture/reflow sensitive electronic components by maintaining a dry atmosphere in the storage area of SMD placement machine. The invention targets primarily moisture sensitive components stored in trays, tapes (bobbins), sticks, linear bands or bulk feeders. The invention includes the process and the apparatus associated with maintaining a dry environment around the components.

The storage of components in a dry environment can provide both moisture prevention and can dry components that have acquired some moisture. The drying time with a dry environment of nitrogen at room temperature is slightly longer than a 125° C., 24 hour baking process. However, the lower temperature nitrogen drying does not alter the component solderability or damage the integrated circuit carrier.

EXAMPLE 1

FIG. 3 is a graph illustrating the saturation curves of four types of components of different inner constitutions in an atmosphere of 30° C. and 60% relative humidity. The percentages of moisture absorbed by these components ranged from about 0.12% to about 0.21% of their weight in moisture. These components would be at risk for moisture-induced failure. The 'safe' limit for these components is 0.1% moisture. Thus, to render these components damage free, it would be necessary to remove about 0.02% to about 0.11% to bring the components under the safe limit.

Plant temperatures and conditions vary, but are generally inferior to the 30° C. and 60% relative humidity conditions tested. Therefore, the goal of one embodiment of the present invention is to remove at least 0.1% of the weight of the sensitive component by dry gas storage. This does not correspond to actual drying of the component according to the standard which considers a component dry when it no longer loses water by drying at 125° C. However, removal of at least 0.1% of the weight of the sensitive component should avoid the risk of moisture-induces failure by eliminating a sufficient amount of moisture from a sensitive component when the floor life has expired.

EXAMPLE 2

The drying power of nitrogen as a dry gas on MS level 3 components was evaluated and is shown in FIG. 4. The drying power is evaluated at the temperatures of 24° C., 60° C., and 125° C. by measuring the weight loss of the components over time. The parts of the curves in FIG. 4 shown in full lines represent the measurements taken and the dotted lines were extrapolated using the following equation:

$$W = A \exp(B/t+F) - C$$

Where W is the weight loss in mg, t is the time in hours, and A, B, C, and F are constants determined for each curve by successive approximations.

The weight loss greatly varies according to the temperature. The 0.1% weight loss goal is obtained, as shown in FIG. 4, in a little over 150 hours at 25° C. and in only about 24 hours at 60° C.

EXAMPLE 3

FIG. 5 illustrates the drying power of nitrogen as a dry gas on two MS level 3 components. The drying power is evaluated at the temperatures of 40° C. and 50° C. by measuring the weight loss of the components over time. The parts of the curves in FIG. 5 shown in full lines represent the measurements taken and the dotted lines were extrapolated as described above. A 10° C. reduction in temperature is shown to increase the drying time required to reach the threshold of 0.1% by almost on third. This indicates the importance of optimizing the temperature parameter under the constraints posed by the storage area.

The difference between the drying times of the QFP 44 component and the PLCC 28 component is explained by the relative thicknesses of the components (1.8 mm versus 3.9 mm). The thinner the component, the more sensitive the component is to moisture and the more effective the soft drying of component with the nitrogen or other dry gas.

While the invention has been described in detail with reference to the preferred embodiments thereof, it will be apparent to one skilled in the art that various changes and modifications can be made and equivalents employed, without departing from the present invention.

What is claimed is:

1. A method of mounting electronic components on a printed circuit board, the method comprising:
   providing a surface mount device placement machine enclosing a storage area therein;
   storing electronic components in a the storage area;
   maintaining a dry atmosphere in the storage area by injecting dry gas into the storage area;
   removing the components from the storage area; and
   mounting the components on a printed circuit board using the placement machine.

2. The method of claim 1, wherein the storage area includes trays containing the components.

3. The method of claim 1, wherein the storage area includes tapes containing the components.

4. The method of claim 1, wherein the storage area includes sticks containing the components.

5. The method of claim 1, wherein the storage area includes components in bulk storage.

6. The method of claim 1, wherein the dry atmosphere in the storage area is provided by delivering a dry gas to the storage area.

7. The method of claim 6, wherein a flow rate of the dry gas delivered to the storage area is controlled by a control system including a humidity sensor within the storage area.

8. The method of claim 6, wherein the dry gas is delivered to the storage area at a first flow rate when the storage area is open and is delivered at a second flow rate when the storage area is closed.

9. The method of claim 8, wherein the first flow rate is higher than the second flow rate.

10. The method of claim 1, further comprising removing about 0.1% or more of the weight of the component by elimination of moisture while the components are stored in the storage area.

\* \* \* \* \*